United States Patent
Sanchez et al.

(10) Patent No.: US 9,029,264 B2
(45) Date of Patent: May 12, 2015

(54) METHODS FOR DEPOSITING A TIN-CONTAINING LAYER ON A SUBSTRATE

(71) Applicant: Applied Materials, Inc., Santa Clara, CA (US)

(72) Inventors: Errol Antonio C. Sanchez, Tracy, CA (US); Yi-Chiau Huang, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/779,713

(22) Filed: Feb. 27, 2013

(65) Prior Publication Data

US 2013/0240478 A1    Sep. 19, 2013

Related U.S. Application Data

(60) Provisional application No. 61/610,817, filed on Mar. 14, 2012.

(51) Int. Cl.
| | | |
|---|---|---|
| *H01L 21/311* | (2006.01) | |
| *C23C 16/513* | (2006.01) | |
| *C23C 16/30* | (2006.01) | |
| *C23C 16/06* | (2006.01) | |
| *C23C 16/44* | (2006.01) | |

(52) U.S. Cl.
CPC .............. *C23C 16/513* (2013.01); *C23C 16/30* (2013.01); *C23C 16/06* (2013.01); *C23C 16/4412* (2013.01)

(58) Field of Classification Search
CPC ................... H01L 21/02452; H01L 21/28556; H01L 31/1884; H01L 21/02381; H01L 21/0245; H01L 21/02535; C23C 16/30; C23C 16/513
See application file for complete search history.

(56) References Cited

U.S. PATENT DOCUMENTS

| | | | |
|---|---|---|---|
| 4,461,783 A * | 7/1984 | Yamazaki | ............... 136/258 |
| 4,878,993 A | 11/1989 | Rossi et al. | |
| 7,718,469 B2 | 5/2010 | Hasan | |
| 2001/0002280 A1 * | 5/2001 | Sneh | ............ 427/255.28 |
| 2004/0110391 A1 | 6/2004 | Ahn et al. | |
| 2005/0118427 A1 | 6/2005 | Linden et al. | |
| 2010/0290015 A1 * | 11/2010 | Banine et al. | ............... 355/30 |

OTHER PUBLICATIONS

International Search Report and Written Opinion mailed Jun. 27, 2013 for PCT Application No. PCT/US2013/028162.

* cited by examiner

*Primary Examiner* — Lan Vinh
*Assistant Examiner* — Jiong-Ping Lu
(74) *Attorney, Agent, or Firm* — Moser Taboada; Alan Taboada

(57) ABSTRACT

Methods of depositing a tin-containing layer on a substrate are disclosed herein. In some embodiments, a method of depositing a tin-containing layer on a substrate may include flowing a tin source comprising a tin halide into a reaction volume; flowing a hydrogen plasma into the reaction volume; forming one or more tin hydrides within the reaction volume from the tin source and the hydrogen plasma; and depositing the tin-containing layer on a first surface of the substrate using the one or more tin hydrides.

12 Claims, 3 Drawing Sheets

METHODS FOR DEPOSITING A TIN-CONTAINING LAYER ON A SUBSTRATE

CROSS-REFERENCE TO RELATED APPLICATIONS

This application claims benefit of U.S. provisional patent application Ser. No. 61/610,817, filed Mar. 14, 2012, which is herein incorporated by reference.

FIELD

Embodiments of the present invention generally relate to methods for depositing layers on substrates, and more specifically, to methods for depositing a tin-containing layer on a substrate.

BACKGROUND

Tin-containing alloys, for example, such as those including germanium (Ge), silicon (Si) or combinations thereof, may be of importance in device applications because of their optical and electronic properties. Unfortunately, conventional tin-containing alloys are formed from a tin source, such as tin tetrahydride ($SnH_4$). Unfortunately, the inventors have observed that tin tetrahydride is unstable. The inventors have further observed that the instability of tin tetrahydride may result in poor alloy quality, such as not having the appropriate band structure or strain due to failed incorporation of tin (Sn) from the tin tetrahydride, and/or lack of manufacturing reproducibility.

Accordingly, improved methods of depositing a tin-containing layer on a substrate are provided herein.

SUMMARY

Methods of depositing a tin-containing layer on a substrate are disclosed herein. In some embodiments, a method of depositing a tin-containing layer on a substrate may include flowing a tin source comprising a tin halide into a reaction volume; flowing a hydrogen plasma into the reaction volume; forming one or more tin hydrides within the reaction volume from the tin source and the hydrogen plasma; and depositing the tin-containing layer on a first surface of the substrate using the one or more tin hydrides.

In some embodiments, a computer readable medium is provided having instructions stored thereon that, when executed, cause a method of depositing a tin-containing layer on a substrate to be performed in a process chamber. The method may be any of the inventive methods disclosed herein.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
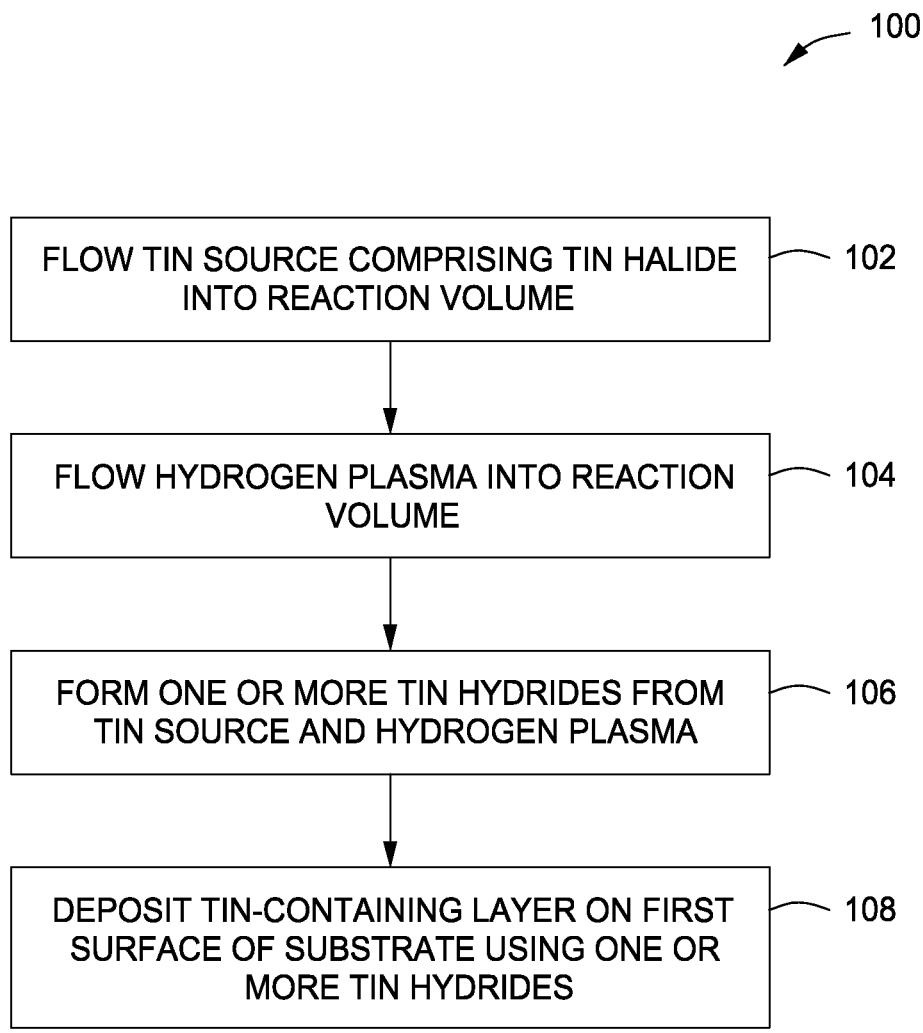
FIG. 1 depicts a flow chart of a method for depositing a tin-containing layer on a substrate in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods for depositing a tin-containing layer on a substrate are disclosed herein. Embodiments of the inventive methods may advantageously allow for improved layer quality, such achieving a desired band structure or layer strain and improved manufacturing reproducibility. Other and further advantages of the inventive methods are discussed below.

Figure 2A:
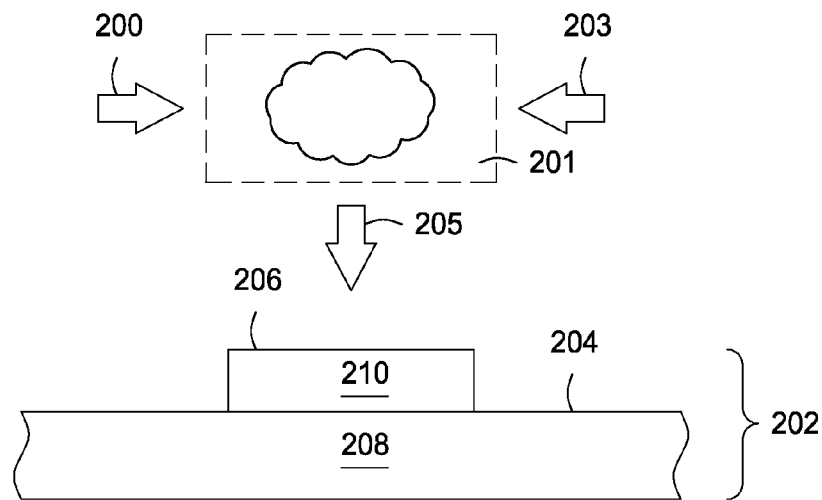
FIGS. 2A-D depicts the stages of fabrication of a tin-containing layer on a substrate in accordance with some embodiments of the present invention.

FIG. 1 depicts a flow chart for a method 100 of depositing a tin-containing layer on a substrate in accordance with some embodiments of the present invention. The method 100 is described below in accordance with stages of fabrication of a tin-containing layer on a substrate as illustrated in FIGS. 2A-D in accordance with some embodiments of the invention. As illustrated in FIG. 2A, a substrate 202 may include multiple surfaces, such as a first surface 204 and a second surface 206. In some embodiments, the first surface 204 may be an exposed surface of a substrate 208 as shown. For example, the substrate 208 may include one or more silicon (Si), germanium (Ge), tin (Sn), or other suitable substrate materials. For example, the substrate may be a silicon substrate, a germanium substrate, a silicon-germanium (SiGe) substrate, a germanium-tin substrate (GeSn), or the like.

In some embodiments, the second surface 206 may be part of a dielectric layer, such as a dielectric layer 210 disposed on the substrate 208. For example, the dielectric layer may comprise one or more of silicon oxide ($SiO_2$), silicon nitride ($Si_3N_4$), or other suitable materials than may be used to form a dielectric layer. The embodiments of the substrate 202 as illustrated in FIG. 2A are merely exemplary and other suitable configurations of the substrate 202 are possible.

In some embodiments, as illustrated in FIG. 2A, the substrate 202 may be part of a partially formed device, such as a metal-oxide-semiconductor field effects transistor (MOSFET). However, the inventive methods described herein may be used to deposit tin-containing layers for use in other devices, such as fin field effects transistors (FinFETs) or the like, or other applications. The tin-containing layers formed be the inventive methods disclosed herein may be used, for example, in source/drain regions or channel regions of transistor devices, as opto-electronic bandgap materials, in complementary metal oxide semiconductor (CMOS) applications or the like.

The method 100 generally begins at 102 by flowing a tin source 200 comprising a tin halide into a reaction volume 201. The reaction volume 201 may serve to react the tin source 200 with another reactant prior to entry into a processing volume of a process chamber, such as a process chamber 302 discussed below. The reaction volume 201 may be, for example, a cavity disposed in one or more of a showerhead (e.g., a showerhead 304 discussed below and illustrated in FIG. 3), an injector (e.g., a side entry injector 320), or other gas distribution apparatus for providing a process gas to the processing volume of the process chamber. Alternatively, or in combination, the reaction volume 201 may include the processing volume of the process chamber. For example, the tin source 200 and another reactant may be reacted in the processing volume after being delivered through a showerhead or an injector to the processing volume (e.g., the processing volume and the reaction volume may be at least partially the same).

The tin source may include a tin halide, such as one or more tin chlorides ($SnCl_{1-4}$). In some embodiments, the tin source may comprise tin tetrachloride ($SnCl_4$). Using a tin halide as a tin source as compared to rare and unstable tin sources as discussed above may provide improved layer quality, manufacturability. The tin halide may be a tin halide gas, as discussed above, or an organometallic chloride having the formula $R_xSnCl_y$, where R is methyl or t-butyl, x is 1 or 2, and y is 2 or 3. The tin halide may be provided to the reaction volume 201 at any desired flow rate, for example, such as a flow rate between about 10 sccm and about 300 sccm, such as between about 50 sccm and about 200 sccm, or about 100 sccm. The tin halide may also be mixed with a carrier gas to achieve a desired space velocity and/or mixing performance in a processing chamber.

In some embodiments, the tin halide may be sourced from a solid source of tin halide crystals sublimed into a flowing carrier gas stream such as nitrogen ($N_2$), hydrogen ($H_2$), argon (Ar), or helium (He), or the tin halide may be generated by passing a halogen gas, optionally with one of the above carrier gases, over a solid tin in a contacting chamber to perform the reaction, for example, $Sn+2Cl_2 \rightarrow SnCl_4$. An exemplary contacting chamber is discussed in accordance with an apparatus 300 below and may be disposed adjacent to the processing chamber, coupled thereto by a conduit which may have a length selected to reduce the possibility of tin halide particles depositing in the conduit.

At 104, a hydrogen plasma 203 may be flowed into the reaction volume 201. In some embodiments, the hydrogen plasma 203 may be co-flowed into the reaction volume 201 with the tin source 200. Alternatively, the hydrogen plasma 203 may be flowed into the reaction volume 201 prior to or subsequent to the tin source 200. In some embodiments, the hydrogen plasma 203 and the tin source 200 may be repeatedly and alternately flowed into the reaction volume 201, for example, at any suitable frequency or duty cycle to facilitate a desired reaction between the hydrogen plasma 203 and the tin source 200.

The hydrogen plasma 203 may be formed from a process gas comprising hydrogen ($H_2$), consisting essentially of hydrogen ($H_2$), or consisting only of hydrogen ($H_2$) (with allowances for trace impurities), or any suitable process gas that may be used to form hydrogen radicals for plasma processes. The hydrogen plasma 203 may be flowed from a remote plasma source into the reaction volume 201. For example, the remote plasma source may be any suitable remote plasma source, such as another plasma process chamber coupled to the reaction volume 201 to provide the hydrogen plasma 203 or the like. In some embodiments, to minimize contaminants, the remote plasma source may be a plasma chamber that may be lined with materials that produce minimal levels of contaminants, such as silicon carbide (SiC) liners or the like. However, other plasma sources may be utilized such as tungsten filament sources or the like, but may result in lower purity and/or reliability when generating the hydrogen plasma 203.

At 106, one or more tin hydrides 205 may be formed in the reaction volume 201 from a reaction between the tin source 200 and the hydrogen plasma 203. For example, the one or more tin hydrides may comprise tin tetrahydride ($SnH_4$) or any suitable derivatives of a tin hydride that may be desired for forming a tin-containing layer. By forming the one or more tin hydrides within the reaction volume 201 local to the process chamber, the inventors have discovered that the disadvantages relating to the instability of the tin hydride may be at least partially overcome and tin-containing layers having desired properties may be formed more reproducibly.

At 108, a tin-containing layer 214 may be deposited on the first surface 204 of the substrate 208 by using the one or more tin hydrides 205 as discussed above as illustrated in FIG. 2B. For example, the tin-containing layer 214 may be deposited by any suitable deposition method, such as reduced pressure chemical vapor deposition (CVD) or any other suitable deposition method. The tin-containing layer 214 may be deposited to any desired thickness, such as about 0.001 to about 10 microns. Exemplary tin-containing layers 214 may be one or more of germanium tin (GeSn), silicon germanium tin (SiGeSn) or other suitable tin-containing layers.

The tin-containing layer 214 may be deposited by optionally, co-flowing additional source materials to the processing volume of the process chamber. For example, as discussed below, additional source materials may be co-flowed into the processing volume in any number of variations, such as through a secondary pathway of a showerhead or through an injector, or co-flowed through the same pathway with the one or more tin hydrides 205. For example, each source material can be flowed separately to the processing volume through any of the various showerheads or injectors, or be co-flowed through the same path as discussed below.

For example, additional source materials may include one or more of a silicon source or a germanium source. For example, the silicon source may include one or more silanes ($Si_xH_y$), wherein, for example, y=2x+2, such as disilane ($Si_2H_6$), trisilane ($Si_3H_8$), neopentasilane ($Si_5H_{12}$), or other suitable higher order silanes. The silicon source may include chlorinated silanes, for example, having the generic formula $Si_xH_yCl_z$, y+z=2x+2, x=1, 2, . . . Exemplary chlorinated silanes may include dichlorosilane ($SiH_2Cl_2$), tetrachlorosilane ($SiCl_4$) or the like. For example, the germanium source may include one or more germanes ($Ge_xH_y$), wherein, for example, y=2x+2, such as digermane ($Ge_2H_6$), trigermane ($Ge_3H_8$), higher order germanium hydrides, or the like. The germanium source may be chlorinated germanes, for example, having the generic formula $Ge_xH_yCl_z$, y+z=2x+2, x=1, 2, . . . Exemplary chlorinated germanes may include germanium tetrachloride ($GeCl_4$) or the like. Depending on the desired concentration of tin in the tin-containing layer 214, higher order silanes such as trisilane and/or neopentasilane may be needed as silicon sources to incorporate higher concentrations of tin into the tin-containing layer 214. For example, such as when the tin-containing layer comprises a silicon germanium tin (SiGeSn) layer, higher concentrations of tin, such as about 8 to about 9 percent, may be achievable at temperatures of about 450 degrees Celsius or below, for example, ranging from about 300 to about 450 degrees Celsius, which may require higher order silanes to form the desired layer at the desired tin concentration.

In some embodiments, a second gas, such as one or more of hydrogen ($H_2$), nitrogen ($N_2$), helium (He), argon (Ar), or the like may be co-flowed with any one or more of the additional source materials, the tin source 200, the hydrogen plasma 203, or the one or more tin hydrides 205. In some embodiments, the second gas may be used to liberate source elements, such as silicon, germanium, or the like from aforementioned source materials. In some embodiments, the second gas may be used as a carrier gas to achieve a desired flow velocity of any one or more of the additional source materials, the tin source 200, the hydrogen plasma 203, or the one or more tin hydrides 205. For example, a higher flow velocity may be used to improve uniformity of the tin-containing layer 214 being formed.

Optionally, addition sources may be co-flowed with the silicon, germanium, and tin sources, for example, such as dopant sources. Typical dopants may include one or more of boron (B), phosphorus (P), arsenic (As) or the like. For example, dopants sources may include diborane ($B_2H_6$), phosphine ($PH_3$), arsine ($AsH_3$) or the like. Additional, dopants and/or dopant sources may be utilized.

The one or more tin hydrides 205 and optionally, the additional source materials may be flowed at any desired ratios to produce the tin-containing layer 214. For example, the ratios may be adjusted in accordance with temperature and/or pressure conditions to produce the tin-containing layer 214 having a desired composition. In some embodiments, the one or more tin hydrides 205 and optionally, the additional source materials may be flowed at temperatures of about 450 degrees Celsius or below, for example ranging from about 300 to about 450 degrees Celsius, and/or flowed at pressures of about 100 Torr or below, or for example, ranging from about 20 to about 200 Torr. In some embodiments, such as discussed above, a higher concentration of tin in the tin-containing layer 214 may be achieved at lower temperatures in the range. As discussed above, at lower temperatures in the range, higher order silanes may be required. For example, at higher temperatures in the range, and when the desired concentration of tin is about 1 to about 2 percent, lower order silanes, such as disilane may be utilized. At lower temperatures, for example, below about 450 degrees Celsius, and when the desired concentration of tin is up to about 8 percent, or up to about 9 percent, or in some embodiments more, a higher order silane, such as trisilane, may be required.

Figure 2B:
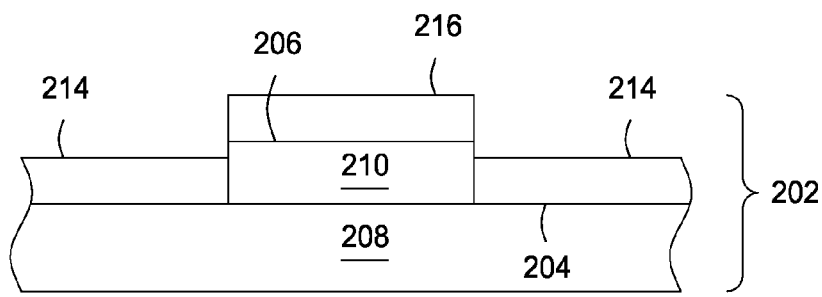
Figure 2C:
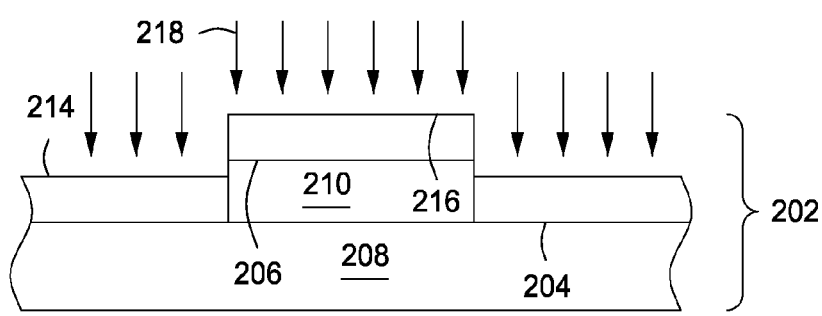

As illustrated in FIG. 2B, a portion 216 of the tin-containing layer 214 may be deposited on the second surface 206 of the dielectric layer 210. In some embodiments, as illustrated in FIG. 2C, the tin-containing layer 214 may be etched using an etchant 218 to selectively remove the portion 216 of the tin-containing layer 214 that has deposited on the second surface 206 of the dielectric layer 210. For example, the deposition and etching of the tin-containing layer 214 may be performed simultaneously or alternated. The etchant 218 may comprise at least one or chlorine (Cl) or bromine (Br) and, optionally, hydrogen (H). For example, in some embodiments, the etchant may be at least one of hydrogen chloride (HCl), hydrogen bromide (HBr), chlorine ($Cl_2$), or bromine ($Br_2$).

Figure 2D:
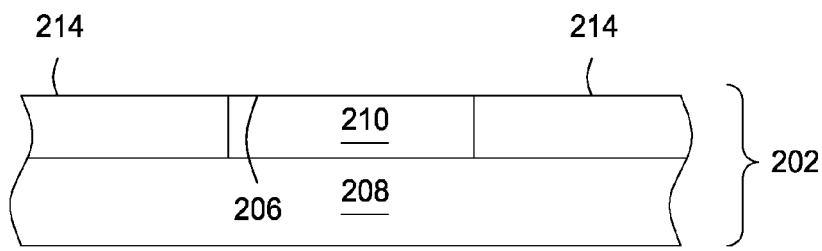

FIG. 2D illustrates the tin-containing layer 214 selectively grown to a desired thickness wherein the tin-containing layer 214 is not present on the second surface 206 of the dielectric layer 210 after the selective etching process discussed above.

Thus, improved methods of depositing tin-containing layers on a substrate have been provided. The tin-containing layers may be grown on all exposed surfaces of the substrate, or selectively on desired surfaces of the substrate. The tin-containing layers may comprise a variety of compositions having desired concentrations of tin and other constituent elements. The concentrations of tin and the other constituent elements may be uniform throughout the layer or may be graded.

Figure 3:
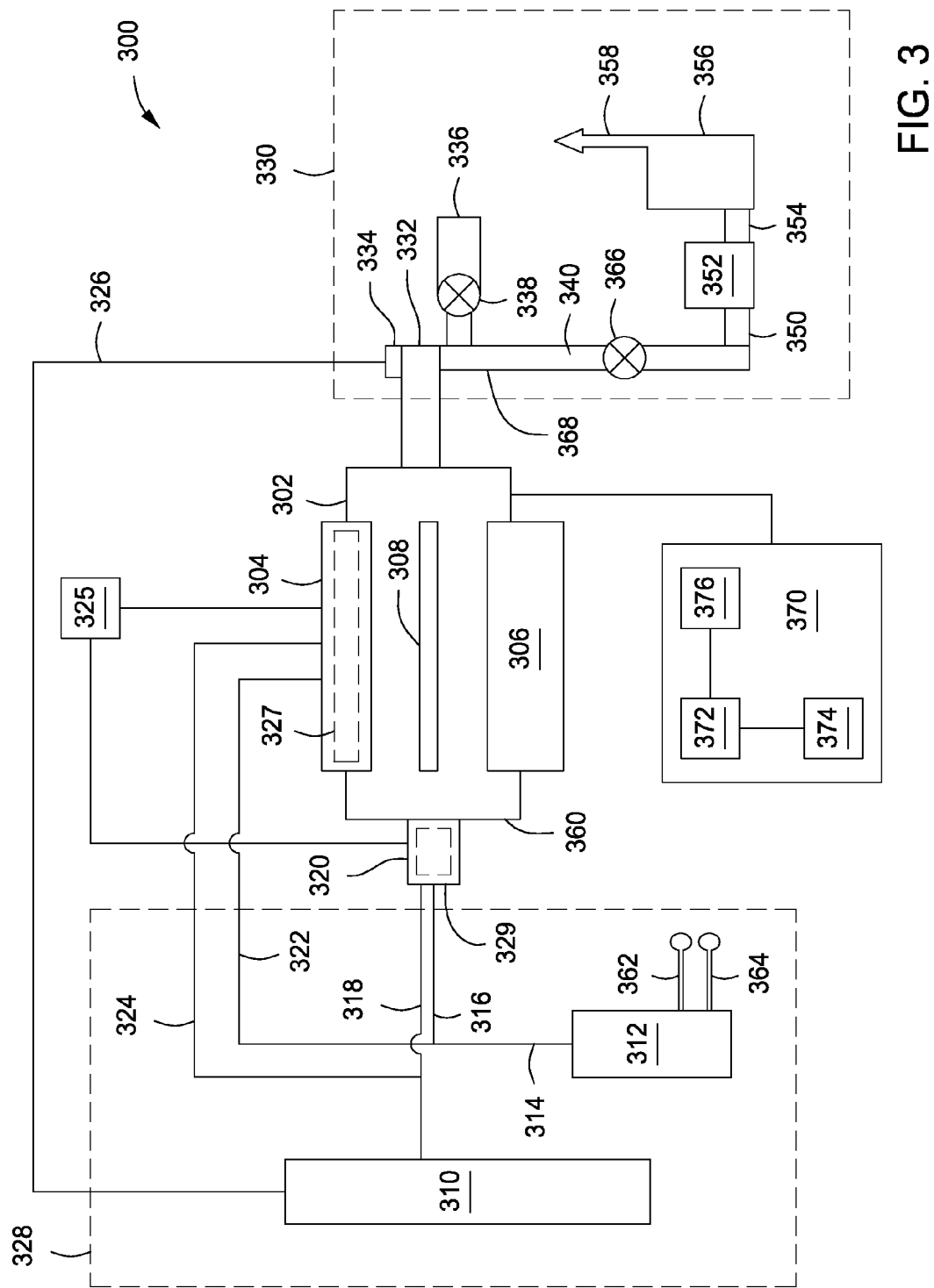
FIG. 3 depicts a schematic side view of an apparatus for depositing a layer on a substrate in accordance with some embodiments of the present invention.

FIG. 3 is a schematic diagram of an apparatus 300 according to another embodiment. The apparatus 300 is useable for practicing the methods described herein for forming a tin-containing layer. A processing chamber 302 has a substrate support 308, which may be a rotating substrate support, disposed in an interior thereof. A heat source 306 is disposed facing one side of the substrate support 308. Alternately, a heat source may be embedded in the substrate support 308. A chamber with a heated substrate support as described in commonly assigned U.S. Pat. No. 7,172,792, entitled "Method for forming a high quality low temperature silicon nitride film", issued Feb. 6, 2007, may be adapted to build the apparatus described herein and to practice the methods described herein. A chamber with a lamp heating module as described in commonly assigned U.S. Patent Publication 2008/0072820, entitled "Modular CVD Epi 300 mm Reactor", published Mar. 27, 2008, may also be adapted to build the apparatus described herein and to practice the methods described herein. An Epi™ 300 mm reactor or a 300 mm xGen™ chamber, both available from Applied Materials, Inc., of Santa Clara, Calif., may be adapted to make and use embodiments described herein. The processing chamber 302 may have a showerhead 304 for gas entry into the chamber. Alternately, or in combination, gas may be provided to the processing chamber through a side entry injector 320 coupled to a side wall 360 of the chamber 302.

A feed system 328, including a chemical delivery system 310 and a metal precursor contact chamber 312, is coupled to the chamber 302 through a variety of conduits. A first conduit 322 and a second conduit 324 may couple the feed system 328 to the optional showerhead 304. The showerhead 304 may be a dual-pathway showerhead to prevent mixing of the sources (e.g., silicon, germanium, and/or tin sources) prior to entry into the chamber 302. An exemplary dual-pathway showerhead is described in commonly assigned U.S. Pat. No. 6,983,892, entitled "Gas distribution showerhead for semiconductor processing", issued Jan. 10, 2006.

Alternately, or additionally, cross-flow gas injection may be practiced by providing first and second cross-flow gas conduits 316 and 318 to the side entry injector 320. An example of a cross-flow injection configuration is described in U.S. Pat. No. 6,500,734. The apparatus 300 may contain both a showerhead configuration and a cross-flow injection configuration, optionally with an adjustable gas flow ratio between the two, or only one or the other configuration.

A remote plasma source 325 may be coupled to one or more of a cavity 327 of the showerhead 304 or a cavity 329 of the side entry injector 320. As discussed above, the cavities 327, 329 may be used as the reaction volume 201. The remote plasma source 325 may be any suitable remote plasma source as discussed above.

The chemical delivery system 310 delivers silicon, germanium, or tin sources, optionally with carrier gases such as nitrogen ($N_2$) and/or hydrogen ($H_2$), to the chamber 302. The chemical delivery system 310 may also deliver deposition or selectivity control species to the chamber 302. The chemical delivery system 310 may include liquid or gaseous sources and controls (not shown), which may be configured in a gas panel.

A contact chamber 312 may be coupled to either the side entry point 320 or the showerhead 304 by a conduit 314 disposed to carry a metal precursor to the chamber 302. Conduits 314, 316, and 322 may be heated to a temperature between about 50° C. and about 200° C. to control or prevent condensation of the metal precursor therein. The contact chamber 312 typically contains a bed of solid metal or metal halide crystals. The metal halide crystals (e.g., a tin halide) may be sublimed into a carrier gas provided through one or both of the gas feed conduits 362 and 364. The solid metal may be contacted with a halogen gas source provided through one or both of the gas feed conduits 362 and 364. In one embodiment, a halogen gas source is provided through a first gas feed conduit 362 while a carrier gas is provided through a second gas feed conduit 364. The gases, either for subliming or reacting, may be flowed through a powdered metal or metal halide fluidized bed to enhance contacting. A mesh strainer or filter may be used to prevent entrainment of particles into the chamber 302. Alternately, the gases may flow across a fixed solid metal or metal halide bed.

An exhaust system 330 is coupled to the chamber 302. The exhaust system 330 may be coupled to the chamber at any convenient location, which may depend on the location of the gas entry into the chamber. For gas entry through the showerhead 304, the exhaust system may be coupled to a bottom wall of the chamber, around the heat source 306, for example, by one or more portals or through an annular opening. An annular manifold may be disposed near an edge of the substrate support and coupled to the exhaust system 330 in some embodiments. For cross-flow embodiments, the exhaust system 330 may be coupled to a side wall of the chamber opposite the side entry point 320.

An exhaust conduit 340 couples an exhaust cap 332 to a vacuum pump 352 through a throttle valve 366. A jacket 368 encloses the exhaust conduit 340 and throttle valve 366 from the exhaust cap 332 to an inlet 350 of the vacuum pump 352. The jacket 368 enables thermal control of the exhaust conduit 340 to prevent condensation of exhaust species in the line. Any heating medium, such as steam, or hot air, water, or other hot fluid, may be used to maintain the exhaust conduit at a temperature above a dew point of the exhaust gas. Alternately, the jacket may include resistive heating elements (i.e. an electric blanket). A condensation trap 336 may be coupled to the exhaust conduit 340 by a valve 338, if desired, to further enhance trapping of any condensates in the exhaust system 330. The vacuum pump 352 pays off to an abatement system 356 through an abatement conduit 354, which is typically not heated or jacketed, and cleaned gas exhausted at 358. To further reduce wetting or nucleation in the exhaust conduit 340, the exhaust conduit 340 may be coated with quartz or with an inert polymer material.

Plasma or ultraviolet activated cleaning agents may be coupled into the exhaust system 330 by active source 334, which may be coupled to a microwave or RF chamber for generating active cleaning species. A cleaning gas line 326 may provide cleaning gases from the chemical delivery system 310 to the exhaust conduit 340, proceeding through the active source 334, if desired. Use of active species for cleaning allows cleaning to proceed at reduced temperatures.

A method for cleaning a chamber used to perform the methods described herein, such as the chamber 302, may include providing a halogen gas to the chamber, converting residues to volatile halides. Temperature of the chamber is typically maintained below about 600° C. during cleaning, and metal deposits are converted to $MCl_x$. The halogen gas may be chlorine gas, fluorine gas, HCl, or HF. The chamber may be heated to an extent that separate heating of the exhaust conduit is not needed, especially if the exhaust conduit is insulated. Alternately, chamber temperature may be kept below about 400° C., if desired, and the exhaust conduit 340 heated to prevent condensation.

A controller 370 may be provided and coupled to various components of the apparatus 300 to control the operation thereof. The controller 370 includes a central processing unit (CPU) 372, a memory 374, and support circuits 376. The controller 370 may control the apparatus 300 directly, or via computers (or controllers) associated with particular process chamber and/or support system components. The controller 370 may be one of any form of general-purpose computer processor that can be used in an industrial setting for controlling various chambers and sub-processors. The memory, or computer readable medium, 374 of the controller 370 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 376 are coupled to the CPU 372 for supporting the processor in a conventional manner. These circuits include cache, power supplies, clock circuits, input/output circuitry and subsystems, and the like. Inventive methods as described herein may be stored in the memory 374 as software routine that may be executed or invoked to control the operation of the process chamber 300 in the manner described herein. The software routine may also be stored and/or executed by a second CPU (not shown) that is remotely located from the hardware being controlled by the CPU 372.

While the foregoing is directed to embodiments of the present invention, other and further embodiments of the invention may be devised without departing from the basic scope thereof.

The invention claimed is:

1. A method of depositing a tin-containing layer on a substrate, comprising:
    flowing a tin source comprising a tin halide into a reaction volume separate from the substrate;
    flowing a hydrogen plasma into the reaction volume;
    forming one or more tin hydrides within the reaction volume from the tin source and the hydrogen plasma; and
    depositing the tin-containing layer on a first surface of the substrate using the one or more tin hydrides.

2. The method of claim 1, wherein the tin halide comprises tin tetrachloride ($SnCl_4$).

3. The method of claim 1, wherein the reaction volume is disposed within a processing volume of a process chamber having the substrate disposed within a processing volume.

4. The method of claim 1, wherein the reaction volume is a cavity of at least one of a showerhead or an injector and wherein the one or more tin hydrides are flowed from the cavity of the at least one of the showerhead or the injector into a processing volume of a process chamber having the substrate disposed in the processing volume.

5. A method of depositing a tin-containing layer on a substrate comprising:
    flowing a tin source comprising a tin halide into a reaction volume;
    flowing a hydrogen plasma into the reaction volume;
    forming one or more tin hydrides within the reaction volume from the tin source and the hydrogen plasma;
    depositing the tin-containing layer on a first surface of the substrate using the one or more tin hydrides; and
    co-flowing one or more of a silicon source or a germanium source with the one or more tin hydrides to deposit the tin-containing layer.

6. The method of claim 5, further comprising:
    co-flowing a dopant source with one or more of the silicon source, the germanium source, or the one or more tin hydrides.

7. The method of claim 1, further comprising:
    flowing a dopant source while depositing the tin-containing layer.

8. The method of claim 1, wherein the tin-containing alloy further comprises at least one of silicon (Si) or germanium (Ge).

9. The method of claim 1, further comprising:
    etching the tin-containing layer to selectively remove a portion of the tin-containing layer from a second surface of a dielectric layer disposed on the substrate adjacent to the first surface of the substrate.

10. The method of claim 9, wherein depositing the tin-containing layer and etching the tin-containing layer are performed simultaneously.

11. The method of claim 9, wherein depositing the tin-containing layer and etching the tin-containing layer are alternately performed.

12. The method of claim 9, wherein the tin-containing layer is etched using an etchant comprising at least one of bromine (Br) or chlorine (Cl).

* * * * *